United States Patent
Holzmann et al.

(10) Patent No.: US 8,426,930 B2
(45) Date of Patent: Apr. 23, 2013

(54) SENSOR MODULE

(75) Inventors: Martin Holzmann, Gomaringen (DE);
Christian Ohl, Reutlingen (DE); Harald Emmerich, Kusterdingen (DE)

(73) Assignee: Robert Bosch GmbH, Stuttgart (DE)

( * ) Notice: Subject to any disclaimer, the term of this patent is extended or adjusted under 35 U.S.C. 154(b) by 428 days.

(21) Appl. No.: 12/661,788

(22) Filed: Mar. 23, 2010

(65) Prior Publication Data
US 2010/0271787 A1 Oct. 28, 2010

(30) Foreign Application Priority Data
Mar. 30, 2009 (DE) .......... 10 2009 001 969

(51) Int. Cl.
*H01L 23/13* (2006.01)
(52) U.S. Cl.
USPC ............. 257/415; 257/724; 257/E23.125; 361/730; 438/51
(58) Field of Classification Search ............ 438/51
See application file for complete search history.

(56) References Cited

U.S. PATENT DOCUMENTS

| | | | | |
|---|---|---|---|---|
| 6,058,020 A * | 5/2000 | Winterer et al. | ............ | 361/767 |
| 6,100,108 A * | 8/2000 | Mizuno et al. | ............ | 438/51 |
| 6,545,332 B2 * | 4/2003 | Huang | ............ | 257/433 |
| 2004/0041254 A1 | 3/2004 | Long | | |
| 2005/0048692 A1 * | 3/2005 | Hanada et al. | ............ | 438/106 |
| 2005/0103105 A1 * | 5/2005 | Emmerich et al. | ............ | 73/493 |
| 2008/0130935 A1 * | 6/2008 | Sato et al. | ............ | 381/361 |

FOREIGN PATENT DOCUMENTS

| | | |
|---|---|---|
| CN | 1701438 | 11/2005 |
| CN | 1766648 | 5/2006 |
| EP | 025868 | 3/1988 |
| EP | 1662235 | 5/2006 |
| JP | 1940571 | 6/1995 |
| JP | 3900613 | 4/2007 |

* cited by examiner

*Primary Examiner* — Stephen W Smoot
(74) *Attorney, Agent, or Firm* — Kenyon & Kenyon LLP

(57) ABSTRACT

A sensor module includes a housing and a chip system disposed therein, the chip system being disposed on a substrate and being embedded in a sealing layer deposited on the substrate. The chip system is disposed in a window region of a frame structure disposed on the substrate, the frame structure featuring substantially the same thermal expansion properties as the substrate.

14 Claims, 5 Drawing Sheets

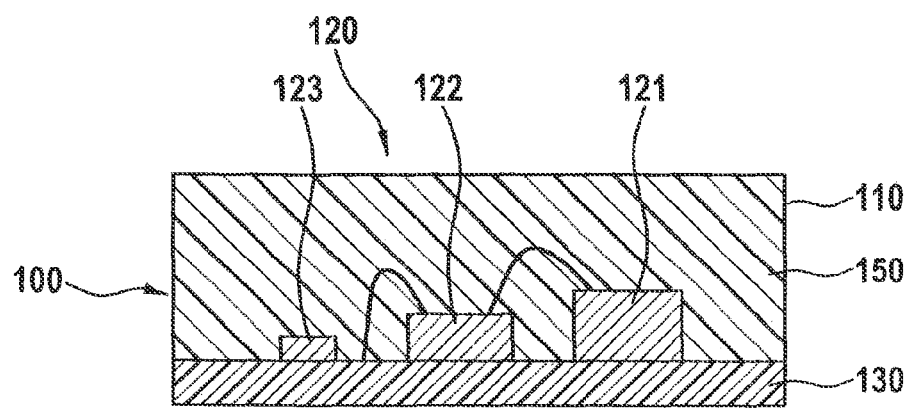
Fig. 1 - PRIOR ART -
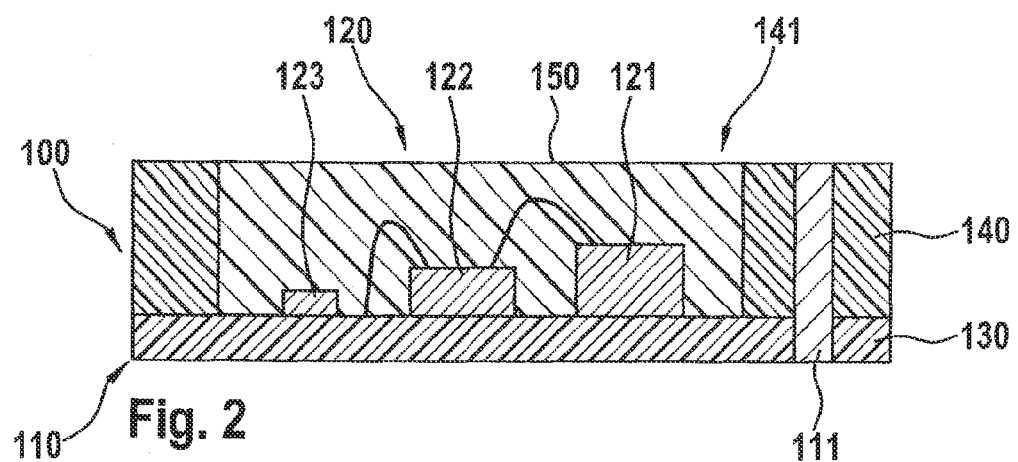
Fig. 2

SENSOR MODULE

BACKGROUND OF THE INVENTION

1. Field of the Invention

The present invention relates to a sensor module having a housing in which a micromechanical sensor is disposed.

2. Description of Related Art

Micromechanical sensors are used in many technical applications. Thus, sensor modules featuring micromechanically manufactured rotation rate sensors or acceleration sensors for determining the current state of motion of a motor vehicle are used in the automotive sector, for example. In such a sensor module, a micromechanically manufactured sensor chip is accommodated in a sensor housing. In this context, the so-called mold housing is a relatively frequently used housing form, in which the sensor chip is embedded in a protective layer made of a plastic mass, for example. To this end, the sensor chip is mounted on a circuit board substrate and sprayed with a suitable molding material. As a rule, the sensor module is made in a so-called multiple printed panel along with additional sensor modules. The finished modules are subsequently separated. This is usually done by sawing. Due to the structure, the contacts of the sensor housing are disposed only on the bottom side.

In a mold housing, mechanical stress occurs on the micromechanical and electronic circuit structures of the sensor chip embedded therein, in particular in the event of temperature differences. This is caused primarily by different properties of the materials used, such as different expansion coefficients among the circuit board substrate and the plastic material. Mechanical stresses may also be induced within the mold housing during its production, however.

The mechanical stress on the sensor chip and on the evaluation circuit may have a negative effect on the sensor characteristic. In unfavorable cases, the mechanical stress in the mold housing may even result in the destruction of the sensors. For example, in the event of mechanical stresses, the sealed glass connection between the sensor chip and an additionally used cap may delaminate.

In order to avoid malfunctions caused by stress, sensors that are particularly mechanically sensitive, such as low-g sensors or rotation rate sensors, are not packaged in the cost-effective mold housing. Instead, more expensive ceramic substrates or premold housings are used for these sensors.

BRIEF SUMMARY OF THE INVENTION

An objective of the present invention is to provide a sensor module having a chip system embedded in a housing, in which the chip system is subjected to lower mechanical stressing.

According to the present invention, a sensor module has a housing in which a chip system is disposed, the chip system being disposed on a substrate and being embedded in a sealing layer deposited on it. In this context, the chip system is disposed in a window region of a frame structure disposed on the substrate, the frame structure and the substrate essentially featuring the same thermal expansion properties. The frame structure helps to avoid a full-surface interface between the molding material and the circuit board, and this may ensure that differing expansion characteristics among the molding material and the circuit board does not lead to risky mechanical stresses in the region of the sensor components. Thus, a cost-effective packaging in the mold housing is possible, even for particularly sensitive sensors.

In an advantageous example embodiment of the present invention, it is provided that the frame structure and the substrate are formed from the same material. The effect achieved by the frame is optimized by this means. Furthermore, this also allows for the production costs to be reduced, since by this means the number of materials used is reduced.

According to an additional example embodiment, the substrate is designed as an electrical circuit board. The production costs may be reduced further by using relatively cost-effective circuit board materials.

An additional example embodiment provides that the frame structure is formed from a plurality of superposed circuit board layers. This is particularly cost-effective since only one material having one layer thickness is used. Furthermore, it is possible to build frame structures of any height with the aid of a plurality of layers.

In an additional advantageous example embodiment, it is provided that a filling material based on a plastic or a gel is used for the surface layer. In particular, by using a relatively soft plastic or a soft gel, the mechanical stresses that are transmitted to the chip components may be significantly reduced.

In an additional advantageous example embodiment, it is provided that the chip system includes a micromechanical sensor chip and/or a microelectronic evaluation chip. It is precisely in particularly sensitive micromechanical sensor chips, such as a low-g sensor or a rotation rate sensor, for example, that a significant increase in the reliability or a reduction of the failure quota may be achieved with the aid of the frame structure.

An additional example embodiment provides that an additional component of the sensor module is disposed on the side of the substrate that is situated opposite the chip system. In particular, less sensitive components of the sensor module may be disposed outside of the module housing in this manner. By this means, it is possible to provide more space for the chip components disposed in the sensor module. Alternatively, the module housing may be made smaller. Thus, for example, chip capacitors may be removed to the outside of the housing in order to reduce influences on the more sensitive sensor components on the one hand, and to create more space for these components inside the housing on the other hand.

An additional advantageous example embodiment provides that the housing features at least one traversing bore hole that progresses inside of the frame structure and/or inside of the substrate and is used to fasten and/or to contact the sensor module. With the aid of such bore holes, on the one hand it is possible to inter-connect a plurality of wiring levels of the module one below the other, which simplifies the connectability of the module in the multiple printed panel and during its mounting on a carrier substrate, for example. On the other hand, such bore holes are suitable for fastening the module on the carrier substrate using press-fit pins.

According to an additional advantageous example embodiment, it is provided that in a sensor device having a sensor module disposed on a carrier substrate, the sensor module is mounted with its upper side on the carrier substrate, the chip system being disposed between the substrate and the carrier substrate. In this instance, the substrate acts as a protective layer for the chip components accommodated in the module housing.

In an additional advantageous example embodiment, it is provided that the substrate acts as a metallic screen for the chip system. By this means, a particularly effective EMC screen may be implemented in a cost-effective manner.

According to the present invention, a panel having a number of sensor modules and a connection region is also provided, in which the chip system of each sensor module is electrically connected to the connection region via conductive patterns on the substrate and corresponding bore holes in the frame structure of the respective sensor module and via conductive patterns progressing on the upper and/or under side of the panel. The routing of the conductive patterns on the upper and under side of the panel may be used to implement data lines and signal lines from the individual sensor modules to one or a plurality of connection regions of the multiple printed panel in a particularly simple and space-saving manner. By this means, a measurement and/or an adjustment of the sensors in the multiple printed panel is simplified in turn.

An additional aspect of the present invention furthermore provides a sensor device having a sensor module disposed on a carrier substrate, including a housing in which a chip system is disposed. In this context, the chip system is disposed on a substrate of the housing and is embedded in a sealing layer deposited on it. Furthermore, the chip system is disposed in a window region of a frame structure disposed on the substrate, the frame structure and the substrate essentially featuring the same thermal expansion properties. It is possible to protect the sensitive chip system in a simple manner from mechanical external influences by mounting the sensor module by its upper side on the carrier substrate, the chip system being disposed between the substrate and the carrier substrate.

In an advantageous example embodiment, it is provided that the substrate acts as a metallic screen for the chip system. By this means, an electromagnetic screen of the chip system may be implemented in a particularly simple manner.

BRIEF DESCRIPTION OF THE SEVERAL VIEWS OF THE DRAWING

FIG. 1 shows a conventional sensor module having a filling material that is deposited all over the carrier substrate.

FIG. 2 shows a sensor module according to the present invention having a chip system disposed on a substrate, and a frame structure having a feed-through and surrounding the chip system in a frame-shaped manner.

DETAILED DESCRIPTION OF THE INVENTION

Figure 3:
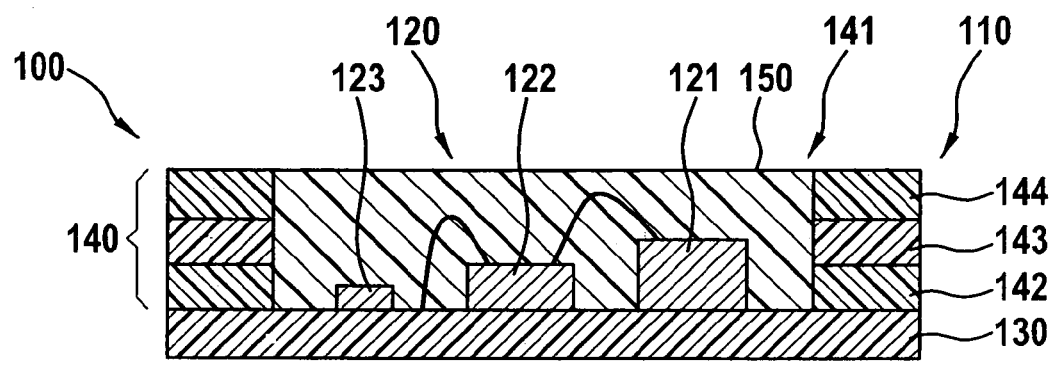
FIG. 3 shows a sensor module according to the present invention having a frame structure made up of multiple layers of the circuit board.

FIG. 1 shows schematically the structure of a conventional sensor module 100 having a sensor housing 110 designed as a mold housing 110. In this housing type, sensor housing 110 is formed from a circuit board substrate 130 and a sealing layer 150 of a molding compound deposited on it. In this context, mold housing 110 accommodates a sensor system 120 having a sensor chip 121 having micromechanical sensor structures, a separate evaluation chip 122, and an additional component 123 of chip system 120. Components 121, 122, 123 are mounted on circuit board substrate 130 and are interconnected via bonding wires or conductive patterns on circuit board 130 that are not shown in detail in this instance or feed-throughs of the chips. Chip system 120 is completely embedded in sealing layer 150, which usually occurs by spraying components 121, 122, 123 with a plastic molding material. Components 121, 122, 123 are usually connected via conductive patterns, which progress on or in circuit board substrate 130 (not shown here).

Due to differing material properties of sealing layer 150 and of circuit board substrate 130, temperature fluctuations, as may occur during the production or operation of module 100, may result in different thermal expansion characteristics in the two housing parts 130, 150, among other things. Since in this housing type the interface between sealing layer 150 and circuit board substrate 130 progresses in only one plane, a different lateral expansion of the two housing parts results in mechanical stresses at their boundary layer, in a manner similar to a bimetal effect. Since chip components 121, 122, 123 are mounted on circuit board 130 on the one hand, and on the other hand are embedded in the plastic material of sealing layer 150, the mechanical stresses prevailing between the two housing parts are transmitted to them. In particular, in this connection, shear forces occur, which may damage sensitive structures such as contactings or micromechanically produced structures on chip components 121, 122, 123.

FIG. 2 illustrates schematically a sectional view through a sensor module 100 according to the present invention. Sensor module 100 features a frame structure 140 disposed on circuit board substrate 130. Frame structure 140, which preferably extends across the entire width of circuit board 130, is designed as a ring-shaped structure running in the edge region of circuit board 130. Chip components 121, 122, 123 are disposed in an opening region or window region 141 of frame structure 140 formed by a depression or recess, window region 141 being filled up to the top edge with a suitable molding material 150 in the case at hand. According to the present invention, it is provided that frame structure 140 essentially features the same thermal expansion characteristics as circuit substrate 130. This is achieved in particular by using the same material for the two housing parts 130, 150. The result of this is that in the event of temperature fluctuations, the lateral expansion of frame 140 essentially corresponds to the lateral expansion of circuit board 130, since the circuit board material extends across the entire thickness of module 100. Since the interface between sealing layer 150 and the housing part formed by circuit board substrate 130 and frame structure 140 now proceeds both in the circuit board plane and also perpendicular to it, the thermal expansion characteristics of this layer 150 in the region surrounded by the frame structure essentially corresponds to the thermal expansion characteristics of circuit board 130. This reduces mechanical stresses between sealing layer 150 and circuit board substrate 130 and thus also mechanical stresses transmitted to chip components 121, 122, 123.

Since frame structure 140 is made up of the relatively hard circuit board material, it also fulfills a support function of module housing 110 in the direction perpendicular to the plane of circuit board substrate 130. Preferably, the height of frame structure 140 is selected such that it surpasses the height of components 121, 122, 123 disposed therein. Thus, frame structure 140 already sufficiently protects components 121, 122, 123 from mechanical influences occurring in the direction perpendicular to the circuit board plane. A material having a lower hardness than the molding compound of the traditional mold housing may be used as sealing layer 150 in this case. For example, relatively soft plastic materials are suitable for this purpose. Furthermore, additional suitable materials, such as a gel, for example, may also be used for the filling. It is also possible for the opening formed by window region 141 to be only partially filled with a filling material. If the use permits, it is even possible to completely omit a filling of opening region 141.

Since in the event of its thermally induced expansion, for example, a softer filling material transmits fundamentally lower forces to components 121, 122, 123 embedded therein, in principle it additionally reduces the mechanical stress of sensor chip 121 and its support structures 122, 123.

As long as a part of frame structure 140 running along one side of circuit board substrate 130 is designed in a sufficiently wide manner, feed-throughs may be implemented in it, e.g., in the form of vertical bore holes. Such bore holes may be used for the contacting of different wiring planes and/or for mounting module 100 on a carrier substrate, for example. Module 100 shown in FIG. 2 features such a bore hole 111, which runs inside of frame structure 140 and circuit board 130 and extends from the upper side of module housing 110 to its under side. By this means, it is possible to implement an electrical connection between a middle wiring plane formed by the conductive patterns of circuit board 130 (not shown in detail here) and the contacts or conductive patterns on the upper side or lower side of module housing 110. As long as the electrical connections of sensor components 121, 122, 123 are routed through bore hole 111 to the upper side of module housing 110, the sensor module may also be mounted in the reverse manner, i.e., with circuit board substrate 130 above. An EMC screen may be obtained in this manner. As long as the connection wiring of the chips is routed from the chip plane to the upper or lower side of module 100 through corresponding bore holes 111, the possibility of measuring and adjusting in the panel is able to be improved, which in turn is reflected by reduced manufacturing costs.

Furthermore, bore holes 111 of this type may be used to secure module 100 on a carrier substrate, for example, with the aid of press-fit pins.

Figure 4:
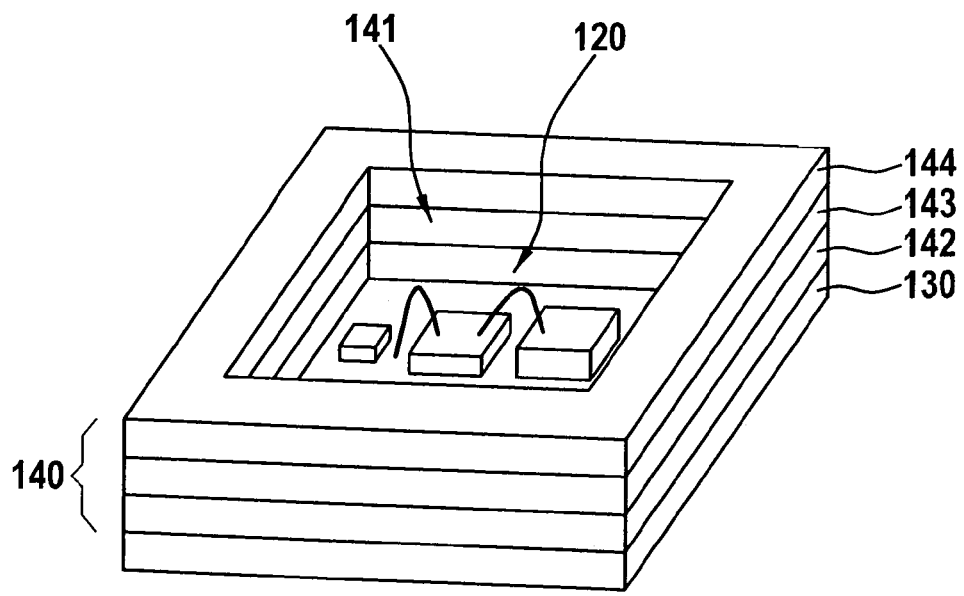
FIG. 4 shows the sensor module of FIG. 3 in a perspective view.

In order to reduce the manufacturing costs of a module 100, it is useful to produce frame structure 140 from the same material that was used to make circuit board substrate 130. Since as a rule this involves a relatively cost-effective material, the manufacturing costs of module 100 may thus be reduced. In this context, frame structure 140 may be made up of a single thick layer and may also be made up of a plurality of superposed circuit boards 142, 143, 144 having respectively lower thicknesses. A sensor module having a frame structure 140 that is structured in a correspondingly layer-shaped manner is shown in FIG. 3. In this instance, frame structure 140 was made out of a total of three thin circuit board layers 142, 143, 144. In this context, the circuit board layers may lie loosely on top of each other and may also be laminated together via an adhesive, for example. The layer-shaped structure allows for frame structures 140 of any height to be implemented in a particularly simple and cost-effective manner. To clarify the structure, FIG. 4 shows a perspective view of the module 100 from FIG. 3 that is structured in a layer-shaped manner. In this context, it is apparent that frame structure 140 is made up of three ring structures 142, 143, 144 that are combined. Since the individual ring structures 142, 143, 144 essentially feature the same contours, an essentially rectangular window region 141 forms inside of the layer stack 140 formed by them, in which chip system 120 is accommodated.

Figure 5:
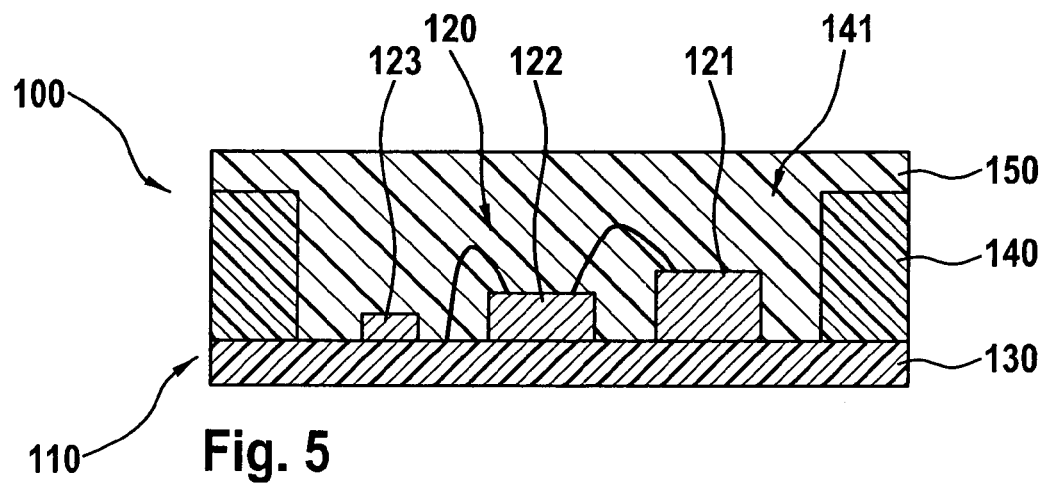
FIG. 5 shows a sensor module according to the present invention having a frame structure and a surface layer covering the frame structure.

FIG. 5 shows a further example embodiment of sensor module 100 according to the present invention. In contrast to the examples shown in FIGS. 2 through 4, in which window region 141 was filled up to the upper edge of frame structure 140 with molding material in each instance, in the exemplary embodiment in question sealing layer 150 also covers the upper side of frame structure 140. By this means, it is possible to achieve a better sealing of interior space 141. Furthermore, by this means, the introduction of the filling material in the multiple printed panel may be simplified, since the still fluid filling material may flow from one module to the next. In this context, it is also possible to provide flow paths only in the upper region of frame structure 140, via which the molding material may flow to adjacent modules when window region 141 is filled up to the top edge of frame structure 140. Such flow paths may be implemented using corresponding slots or recesses in the upper region of frame structure 140.

Figure 6:
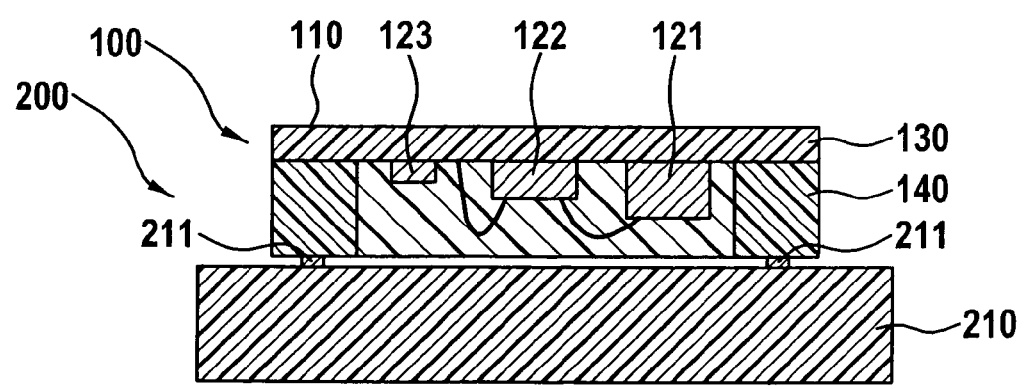
FIG. 6 shows a sensor module mounted on a circuit board, in which the housing substrate is used as a screen.
Figure 7:
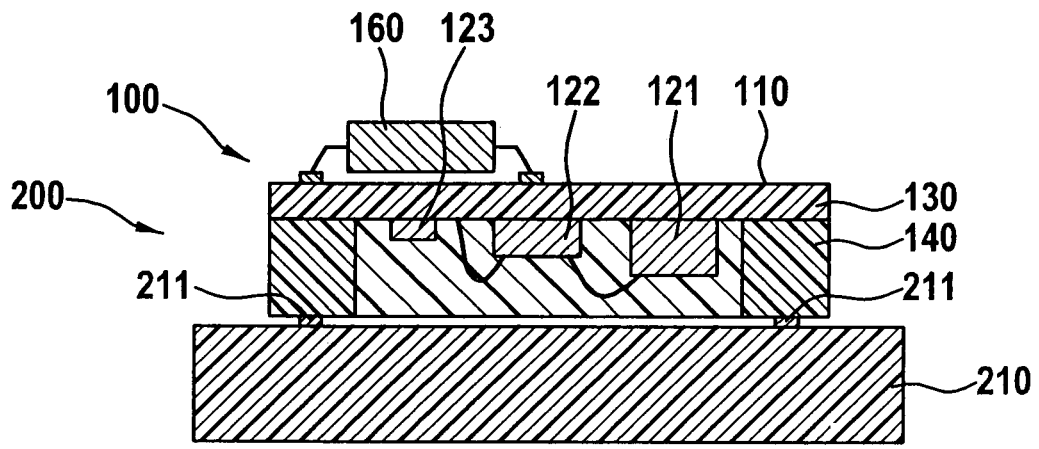
FIG. 7 shows a sensor module mounted on a circuit board having an additional component on the side of the circuit board substrate that is situated opposite the chip system.

With the aid of sensor module 100 according to the present invention, a sensor device may be constructed in which module 100 is mounted on a carrier substrate. FIG. 6 illustrates a corresponding sensor device 200 having a circuit board 210 functioning as a carrier substrate and a sensor module 100 disposed on it. In this context, module 100 may be mounted on carrier substrate 210 via solder contacts 211, for example. As an alternative to this, adhesive connections, for example, using a conductive adhesive, are also possible. The mounting may occur upside down, as shown in FIG. 6 by way of example, the module being fastened to the carrier substrate by its upper side. In this way, chip components 121, 122, 123 are disposed between circuit board substrate 130 and carrier substrate 210. In this case, circuit board substrate 130 acts as a protective layer, which helps to achieve a better mechanical protection of chip system 120. A correspondingly metal-plated circuit board substrate 130 furthermore allows for a metallic screen of chip system 120 (EMC screen).

Due to the special upside-down mounting of module 100 on carrier substrate 210, the now exposed exterior of circuit board substrate 130 may be fitted with additional components 160, such as chip capacitors or resistors, for example. These components may be electrically connected to chip components 121, 122, 123 via corresponding feed-throughs in circuit board substrate 130.

Figure 8:
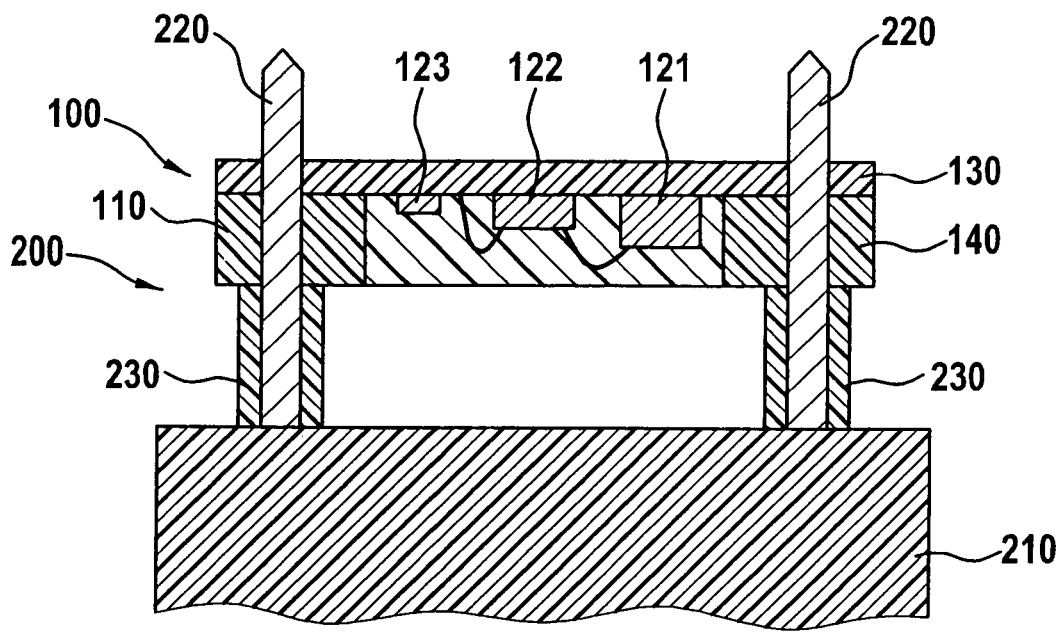
FIG. 8 shows a sensor module mounted on a circuit board using a press-fit pin.

As was already described in conjunction with the sensor module shown in FIG. 2, bore holes 111, which traverse frame structure 140 and circuit board substrate 130, may also be used to mount the module on carrier substrate 210. FIG. 8 illustrates a module 100 that is correspondingly mounted via press-fit pins 220 and spacer tubes 230 on carrier substrate 210. In this context, the preferably metallic pins 220 may simultaneously be used for the electrical contacting between module 100 and corresponding conductive patterns of carrier substrate 210. To this end, circuit board 130 of module housing 110 may feature corresponding press-fit zones, via which an electrical contacting and/or mechanical fastening of sensor module 100 on press-fit pins 220 is implemented.

Figure 9:
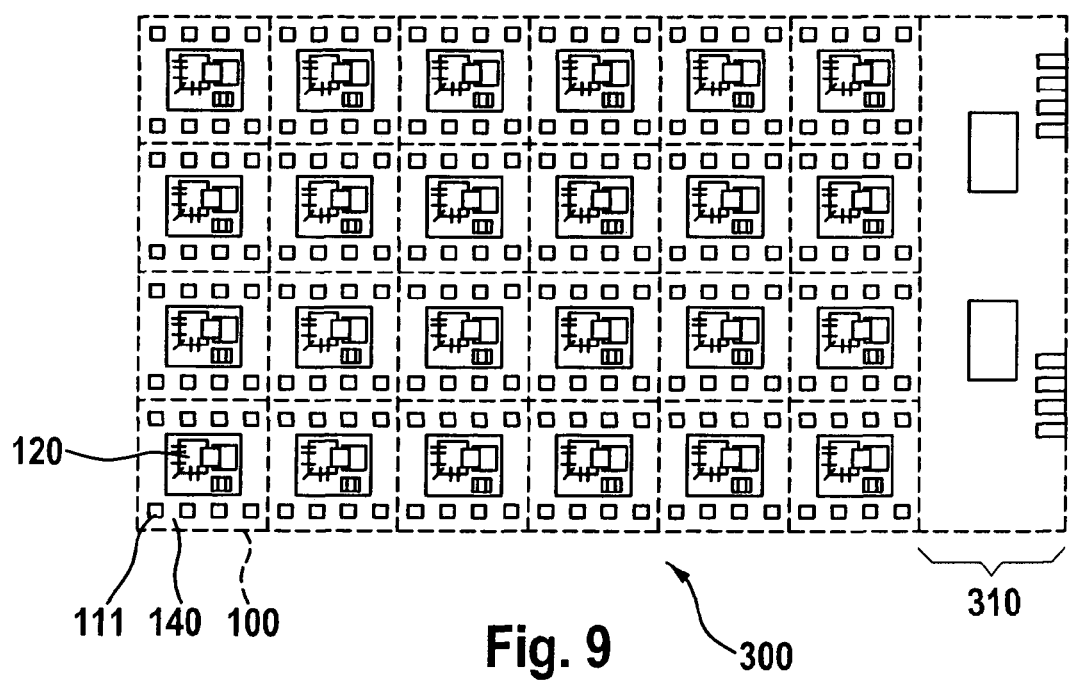
FIG. 9 shows a multiple printed panel having a plurality of sensor modules and a shared connection region.

A multiple printed panel 300 having a total of 24 modules is illustrated in FIG. 9, as is used in the manufacture of module 100 according to the present invention, for example. In this context, individual modules 100 are still disposed on a shared circuit board substrate and are only separated in a subsequent method step by sawing the shared circuit board substrate. In this method state, frame structures 140 of individual modules 100 may also exist as a structure extending across all modules, which not sawed until the separation of the modules.

Providing traversing contact bore holes 111 in individual modules 100 allows for the modules to be wired on the upper side, the under side, and in between in the middle wiring planes of the circuit board. By this means, data and signal lines (not shown here) from individual sensor modules 100 to one or more connection regions 310 of multiple printed panel 300 may be implemented in a particularly simple and space-saving manner, with which the sensors in the multiple printed panel may be measured and/or adjusted.

For the production of chip module 100 according to the present invention, it is preferable to use a circuit board substrate 130, on which conductive patterns for connecting and contacting chip components 121, 122, 123 were produced in previous steps. Chip components 121, 122, 123 may be mounted on circuit board substrate 130 and connected to the conductive patterns. Furthermore, frame structure 140 is disposed on circuit board substrate 130. In this context, frame structure 140 may be connected in a fixed manner to circuit board 130, e.g., using soldering or adhesive bonding. As long as chip components 121, 122, 123 are mounted on circuit board 130 before frame structure 140 is mounted, then there is enough space for its assembly and contacting. Alternatively, frame structure 140 may be disposed on circuit board 130 before the mounting of chip components 121, 122, 123. For example, this may be advantageous when frame structure 140 is also mounted on circuit board substrate 130, and for this purpose substances or temperatures are used that may endanger the electric of micromechanical components of the chip structures. Subsequently, window regions 141 are filled with a suitable filling material 150.

The sensor modules disclosed in the figures and the relevant description are to be understood as exemplary embodiments of the sensor module according to the present invention only. In this instance, all features mentioned may be utilized in the implementation of the present invention, independently of the respective exemplary embodiment. The concept according to the present invention may also be applied to sensor concepts other than the micromechanical sensor. Thus, for example, optical sensors may also be packaged in a sensor housing according to the present invention. Finally, modules having only microelectronic chips may also be configured according to the concept proposed in this instance.

What is claimed is:

1. A sensor module comprising:
a housing; and
a chip system disposed in the housing, wherein the chip system is disposed on a first substrate and embedded in a sealing layer deposited on the first substrate, the chip system being disposed in a window region of a frame structure disposed on the first substrate, and wherein the frame structure has substantially the same thermal expansion properties as the first substrate and the frame structure is affixed to a second carrier substrate and extends from the first substrate to the second carrier substrate.

2. The sensor module as recited in claim 1, wherein the frame structure and the first substrate are made of the same material.

3. The sensor module as recited in claim 1, wherein the first substrate is configured as an electrical circuit board.

4. The sensor module as recited in claim 3, wherein the frame structure includes a plurality of superposed circuit board layers.

5. The sensor module as recited in claim 3, wherein the sealing layer includes one of a plastic filling material or a gel filling material.

6. The sensor module as recited in claim 3, wherein the chip system includes at least one of a micromechanical sensor chip and a microelectronic evaluation chip.

7. The sensor module as recited in claim 6, wherein the sensor chip includes one of a low-g sensor or a rotation rate sensor.

8. The sensor module as recited in claim 3, further comprising:
an additional component disposed on a side of the first substrate situated opposite the chip system.

9. The sensor module as recited in claim 8, wherein the additional component is one of a capacitor or a resistor.

10. The sensor module as recited in claim 3, wherein the housing has at least one bore hole traversing through at least one of the frame structure and the first substrate, wherein the bore hole is used for at least one of fastening and contacting of the sensor module.

11. The sensor module as recited in claim 10, wherein the bore hole connects a wiring plane of the first substrate to at least one of an upper side and a lower side of the housing.

12. A panel comprising:
a plurality of sensor modules, wherein each sensor module includes:
a housing; and
a chip system disposed in the housing, wherein the chip system is disposed on a substrate and embedded in a sealing layer deposited on the substrate, the chip system being disposed in a window region of a frame structure disposed on the substrate, and wherein the frame structure has substantially the same thermal expansion properties as the substrate; and
a connection region;
wherein the chip system of each sensor module is electrically connected to the connection region via (a) conductive patterns on the substrate, (b) corresponding bore holes in the frame structure of the respective sensor module, and (c) conductive patterns on at least one of an upper side of the panel and a lower side of the panel.

13. A sensor device, comprising:
a carrier substrate; and
a sensor module disposed on the carrier substrate, the sensor module including a housing and a chip system disposed in the housing, the chip system being disposed on a substrate of the housing and embedded in a sealing layer deposited on the substrate of the housing, wherein (i) the chip system is disposed in a window region of a frame structure disposed on the substrate, the frame structure and the substrate having substantially same thermal expansion properties, (ii)
an upper side of the sensor module is mounted on the carrier substrate, and (iii) the chip system is disposed between the substrate of the housing and the carrier substrate.

14. The sensor device as recited in claim 13, wherein the substrate of the housing is used as a metallic screen for the chip system.

* * * * *